United States Patent
Da Rocha Mordente et al.

(10) Patent No.: US 10,407,764 B2
(45) Date of Patent: Sep. 10, 2019

(54) INTERNAL-COMBUSTION ENGINE PISTON RING, PROCESS FOR OBTAINING A PISTON RING, AND INTERNAL-COMBUSTION ENGINE

(71) Applicants: Mahle International GmbH, Stuttgart (DE); Mahle Metal Leve S/A, Jundiaí (BR)

(72) Inventors: Paulo Jose Da Rocha Mordente, Jundiaí (BR); Davi Antonio Da Silva, Jundiaí (BR); Nuno Costa, Coimbra (PT)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 0 days.

(21) Appl. No.: 15/517,901

(22) PCT Filed: Oct. 7, 2015

(86) PCT No.: PCT/EP2015/073080
§ 371 (c)(1),
(2) Date: Apr. 7, 2017

(87) PCT Pub. No.: WO2016/055498
PCT Pub. Date: Apr. 14, 2016

(65) Prior Publication Data
US 2017/0306469 A1    Oct. 26, 2017

(30) Foreign Application Priority Data

Oct. 9, 2014 (BR) .......................... 1020140252436

(51) Int. Cl.
*F02B 75/08* (2006.01)
*C23C 14/04* (2006.01)
(Continued)

(52) U.S. Cl.
CPC ............ *C23C 14/044* (2013.01); *C23C 14/22* (2013.01); *F16J 9/14* (2013.01); *F16J 9/26* (2013.01); *F16J 15/12* (2013.01)

(58) Field of Classification Search
CPC .......... F16J 9/26; C23C 14/325; C23C 28/42; C23C 14/542
(Continued)

(56) References Cited

U.S. PATENT DOCUMENTS 5,087,161 A * 2/1992 Gunn .................. F16B 37/0828
411/433
7,052,019 B2 * 5/2006 Miida .................. C23C 14/505
277/443
(Continued)

FOREIGN PATENT DOCUMENTS

CN       1492978 A     4/2004
CN     102575768 A     7/2012
(Continued)

OTHER PUBLICATIONS

Chinese Office Action dated Feb. 5, 2018 related to correspoinding Chines Patent Application No. 201580065763.7.
(Continued)

*Primary Examiner* — Marguerite J McMahon
*Assistant Examiner* — James J Kim
(74) *Attorney, Agent, or Firm* — Fishman Stewart PLLC

(57) ABSTRACT

A piston ring for an internal-combustion engine may include a body having a substantially annular external surface and a physical vapor deposition coating layer disposed on the external surface. The body may include a gap defined between a first end and a second end. The piston ring may also include a first half in a region of the gap and a second half opposite the first half. The coating layer of the first half may have a thickness gradient, and the coating layer may (Continued)

define a greater thickness in a vicinity of the first end and the second end and a reduced thickness in regions further away from the vicinity of the first end and the second end. The coating layer of the second half may have a uniform thickness.

19 Claims, 5 Drawing Sheets

(51) Int. Cl.
  *F16J 9/14* (2006.01)
  *F16J 9/26* (2006.01)
  *F16J 15/12* (2006.01)
  *C23C 14/22* (2006.01)

(58) Field of Classification Search
  USPC .................................. 123/668; 277/434, 433
  See application file for complete search history.

(56) References Cited

U.S. PATENT DOCUMENTS

| | | | | |
|---|---|---|---|---|
| 2002/0175476 | A1* | 11/2002 | Chinou | F16J 9/26 277/440 |
| 2004/0056425 | A1* | 3/2004 | Miida | C23C 14/505 277/459 |
| 2012/0228831 | A1* | 9/2012 | Herbst-Dederichs | F16J 9/14 277/434 |
| 2013/0174419 | A1 | 7/2013 | Meyer | |
| 2013/0307221 | A1* | 11/2013 | Esser | F16J 9/12 277/434 |
| 2014/0013914 | A1* | 1/2014 | Senbokuya | C23C 28/044 83/651 |
| 2015/0226327 | A1* | 8/2015 | Sasaki | F02F 5/00 277/442 |
| 2015/0308573 | A1* | 10/2015 | Sato | F02F 5/00 277/443 |
| 2015/0329968 | A1* | 11/2015 | Tamagaki | C23C 16/4409 118/723 E |
| 2016/0122862 | A1* | 5/2016 | Lammers | C23C 14/0641 277/443 |

FOREIGN PATENT DOCUMENTS

| | | |
|---|---|---|
| CN | 103154583 A | 6/2013 |
| DE | 102010046551 A1 | 3/2012 |
| EP | 2930403 A1 | 10/2015 |
| WO | 2014088096 A1 | 6/2014 |
| WO | WO-2014194874 A1 | 12/2014 |

OTHER PUBLICATIONS

English Abstract for CN102575768A.
Chinese Office Action dated Sep. 26, 2018 related to Chinese Patent Application No. 201580065763.7.

* cited by examiner

INTERNAL-COMBUSTION ENGINE PISTON RING, PROCESS FOR OBTAINING A PISTON RING, AND INTERNAL-COMBUSTION ENGINE

CROSS-REFERENCE TO RELATED APPLICATIONS

This application claims priority to Brazilian Patent Application No. BR 10 2014 0252436, filed on Oct. 9, 2014, and International Patent Application No. PCT/EP2015/073080, filed on Oct. 7, 2015, the contents of which are hereby incorporated by reference in their entirety.

TECHNICAL FIELD

The present invention relates to internal-combustion engine piston rings wherein at least the external surface of the piston ring is provided with a coating layer offering excellent durability owing to the high level of wear resistance and the low level of sliding wear.

BACKGROUND

Internal-combustion engines are formed basically from two principal parts: an engine block (provided with one or more cylinders) and a crankshaft assembly, with which one or more heads are associated. The crankshaft assembly includes pistons, connecting rods and the crankshaft, this assembly being responsible for moving the pistons inside the cylinders of the engine block. The piston is a cylindrical component, usually composed of a metallic base, and comprises one or more rings responsible for providing a sliding seal between the external edge of the piston and the internal wall of the cylinder.

During movement of the piston inside the cylinder, the piston should adhere totally to the walls of the cylinder in such a manner as to prevent the mixture of air and fuel and to prevent the exhaust gases escaping from the combustion chamber to inside the oil pan during compression and combustion and, furthermore, to prevent the oil in the pan being transferred to the inside of the combustion region. Owing to the high level of wear that such a solution would cause, the solution found has been to design a small degree of clearance between the piston and the internal walls of the cylinder, inserting one or more rings around the piston so as to guarantee the necessary insulation.

Usually, the most modern 4-stroke engines use three rings on each piston, two of these rings being compression rings and the other being an oil ring. The two rings placed closest to the piston head are known as compression segments and their purpose is to ensure that there is no leakage of the gaseous mixture to the inside of the pan when the piston is performing the compression movement. The third piston ring is known as the oil ring and its purpose is to scrape excess oil from the wall of the cylinder, thereby controlling the thickness of the oil film.

In general, piston rings are formed by a metallic external surface to which at least one coating layer suitable for entering into contact with the wall of the cylinder is applied.

The function of the coating is extremely important since it seeks to confer on the ring the properties of low sliding wear, high wear resistance, hardness and durability. However, many of these properties are mutually incompatible and an increase in one of them leads to a reduction in performance in terms of another. It should furthermore be noted that the stresses to which the rings are subjected vary along their surface, i.e. the rings are not subject to all the forces uniformly.

Usually, coating layers are applied using ion plating processes, especially physical vapor deposition (PVD), chemical vapor deposition (CVD), or a galvanic plating process.

By means of studies, tests and simulations, the applicant was able to observe that piston rings, specifically compression rings, suffer premature wear in the regions of the ends of the ring.

In this connection, representative prior art is US document US2004056425, which relates to a PVD coating process that guarantees a coating layer of varying thickness, the thickness of the coating layer in the regions of the ends of the ring being 1.5 to 4 times as thick than the coating layer applied over the region outside of the vicinity of the ends of the ring.

The manufacturing process employed involves a variable rotational speed such that the speed will be minimal when the region of the ends of the ring faces the source of coating material, which means that the thickness in the region in the vicinity of the ends of the ring is greater than the coating thickness in the region opposite the ends of the ring. Nevertheless, this process requires very precise, controlled synchronization during said variation in speeds, since, otherwise, the effect of varying the thickness of the coating will not be achieved.

However, an increase in the coating layer in the region in the vicinity of the ends of the ring alone is insufficient to guarantee that the component is more durable. As described in FIG. 2, the thicker the coating layer in the region in the vicinity of the ends of the ring, the greater will be the contact pressure between the ends of the ring and the cylinder of the engine block. Combustion gives rise to high temperatures and an increase in gas pressure, which leads to premature wear that is further exasperated by the situation of a low level of lubrication and contact pressure between the sliding surfaces of the compression ring and this specific region.

It is thus necessary to devise a piston ring and a coating process capable of guaranteeing a varying thickness of the coating layer on the external surface of the ring such that the region in the vicinity of the ends of the ring comprises a coating layer that is thicker than the coating layer in the opposite region in the vicinity of the ends of the ring and, furthermore, with a reduction in the thickness at the ends of the ring, thus providing a piston ring with a high level of durability owing to excellent wear resistance and lower sliding wear overall, with a high level of thickness in that which is the most critical region of the ring, defined as being in the vicinity of the ends.

SUMMARY

An objective of the present invention is to obtain a product with extended durability by means of a physical vapor deposition (PVD) coating process for a piston ring designed for use in an internal-combustion engine, which is capable of providing the compression ring with a coating layer of varying thickness such that the thickness of the coating applied increases gradually from 90° and 270° towards 0° and 360°, respectively. The thickness reaches its maximum value in the region of 10° and 350°. Then, the thickness of this coating diminishes slightly towards 0° and 360° in such a manner as to guarantee optimum working conditions, thereby minimizing contact pressure and consequently accelerated wear in the vicinity of the ends of the ring.

A further objective of the present invention is to provide a process of two subsequent steps in which the first step is capable of depositing a coating of uniform thickness over the entire peripheral region of the ring, i.e. over 360°. In the second step of the process, the deposition is capable of increasing the coating locally in the region of 270°, 360°, 0° and 90°.

The objectives of the present invention are achieved by a piston ring for internal-combustion engines, comprising a substantially annular external surface to which is applied a coating layer using a physical vapor deposition (PVD) process, the ring comprising a gap, a first half defined by the 180° adjacent to the gap and a second half defined by an external surface portion between 90° and 270°, with the gap of the ring being provided with two ends, a first end and a second end, with the first half of the ring having a thickness gradient for the coating layer, the coating layer being thicker in adjacent regions in the vicinity of the ends of the ring, with a reduction in the thickness of the coating layer in the regions in the vicinity of the ends of the ring and the second half of the ring being provided with a uniform thickness of the coating layer.

The objectives of the present invention are further achieved by means of a physical vapor deposition (PVD) process for obtaining an internal-combustion engine piston ring, comprising the following steps:

Step 1: fastening of at least one piston ring on a rotary table, the at least one piston ring comprising a gap positioned opposite at least one source of coating material; the rotary table performing a first rotation movement about its central axis and the at least one ring receiving a first deposition in the region of the external surface defined by the 180° adjacent to the center of the gap by means of the rotation of the rotary table;

Step 2: the rotary table performing the first rotation movement of step 1 and the at least one ring performing a second rotation movement on the rotary table, the source of coating material promoting a second deposition along the entire 0°-360° external surface of the piston ring (1); and With step 1 and step 2 being alternated and the first rotation movement and the second rotation movement being performed in opposite directions, clockwise or counterclockwise.

The objectives of the present invention are further achieved by an internal-combustion engine comprising at least one piston ring as defined above.

BRIEF DESCRIPTION OF THE DRAWINGS

The present invention will be described below in greater detail on the basis of an illustrative embodiment represented the drawings. The Figures show.

DETAILED DESCRIPTION

Figure 1:
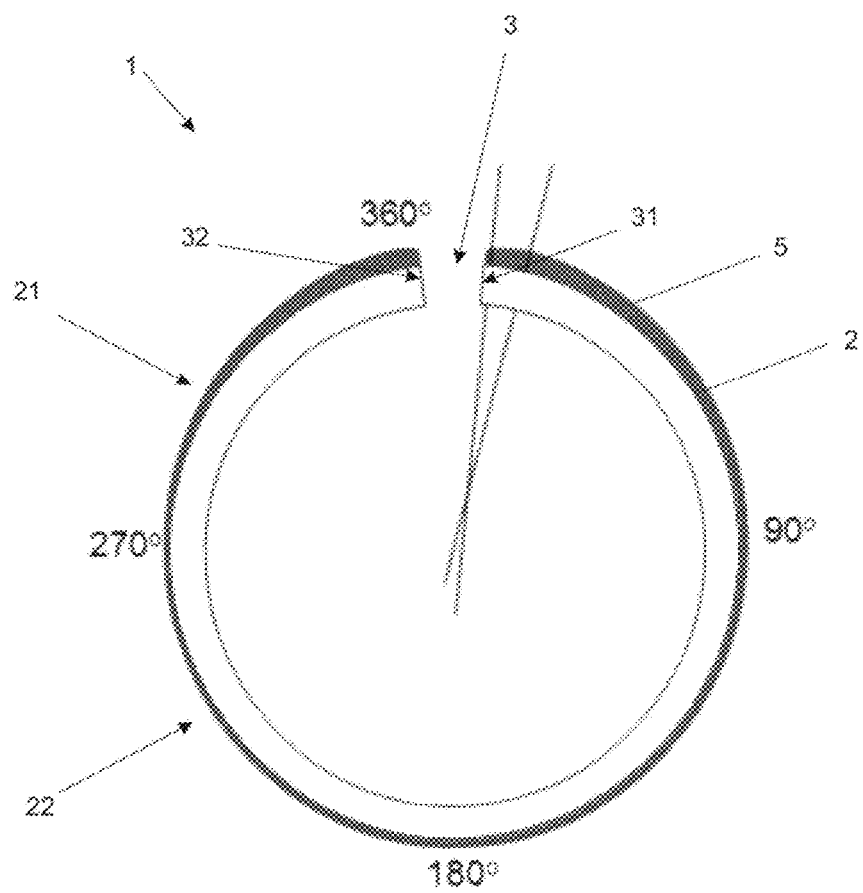
FIG. 1 shows a schematic representation of a piston ring obtained by means of the coating process described in the present invention.
Figure 2:
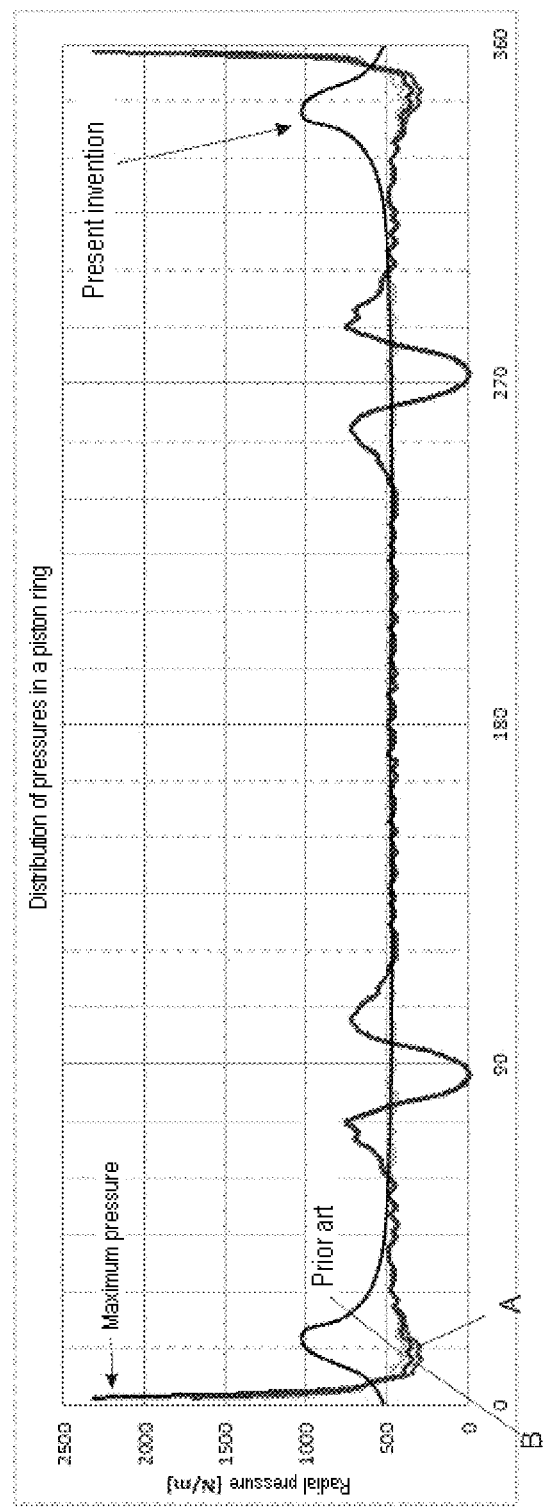
FIG. 2 shows a graphic representation of the pressure distribution from 0° to 360° for a piston ring.

The present invention relates to a piston ring 1 and to a process for deposition of a coating capable of guaranteeing a variable thickness of the coating layer 5 on the external surface 2 of the piston ring 1 such that an adjacent region in the vicinity of the ends 31, 32 of a gap 3 of the ring 1 comprises a coating layer 5 that is thicker than the coating layer in the opposite region in the vicinity of the ends 31, 32 of the ring 1 and, furthermore, with a reduction in the thickness of the coating layer 5 in the vicinity of the ends 31, 32 of the gap 3 of the ring 1, thus providing a piston ring 1 with a high level of durability owing to the excellent resistance and to the high level of thickness in the region of greatest wear of the ring.

As is also known, the entire piston ring 1 is provided with a gap 3, the existence of which guarantees the possibility of mounting the ring in a groove of an internal-combustion engine piston. For the purposes of a better definition of the present invention, the region of the gap 3 of the ring is defined by two ends 31, 32, also known as extremities of the ring. Taking, for example, the center of the gap 3, it may be assumed that this is a total angle of 10°. Thus, the center of the gap 3 will be defined as a zero-degree (0°) angle or a 360° angle. Therefore, each end is positioned at 5° from the center of the gap 30.

In this context, the limit of the first end 31 is positioned at 5° from the center of the gap 3 and the limit of the second end 32 is positioned at 355° from the center of the gap, or −5° from said center. For the purposes of a better understanding of the present invention, the degrees will be measured in the clockwise direction, starting from the center of the gap 3 of the piston ring 1.

In a much simpler way, which will set forth better as the description continues, the process of the present invention consists in performing a first deposition, by PVD, over substantially half the external surface 2 of the ring 1, followed by a second deposition, also by PVD, over the entire external surface 2 of the ring 1, it being possible for the first deposition and the second deposition to be alternated.

More specifically, the first deposition is performed in the region of the ring 1 included between the areas defined by the angles 0° to 90° and 270° to 360°, starting from the center of the gap 3 of the ring 1. Alternately, it may be stated that the surface that receives the first deposition is defined by the 180° adjacent to the center of the gap 3. Said 180° adjacent to the center of the gap will henceforth be called a first half 21 of the ring 1. The opposite portion of the ring 1 will henceforth be called a second half 22 and naturally comprises the portion of the external surface 2 defined by the angles from 90° to 270°.

As may be seen in FIG. 1, the piston ring 1 comprises a substantially annular metallic external surface 2, this surface acting as sliding portion at the interface between the ring 1 and a cylinder lining. The piston ring 1 illustrated in the present invention preferably comprises a compression ring for the first piston groove or, furthermore, a compression ring for the second piston groove.

Notably, the process of the PVD coating of the present invention is provided with a chamber 55 specially designed for this type of deposition, comprising at least one source 52 of coating material 53 and at least one rotary table 50 to which at least one piston ring 1 is fastened.

The chamber 55 preferably, but optionally, comprises an even number of sources 52 of coating material 53. Alternatively, the present invention may be constituted by an uneven number of sources 52. The selection of one, two, three, four, five, six, seven, eight, nine, ten, etc. sources 52 may depend on various specific requirements. For example, in a possible embodiment illustrated in FIG. 3, 4, or 5, four 4 sources may be arranged symmetrically and at uniform distances so as to allow a balanced deposition over all the components to be coated. In sum, in simple terms, the number of sources 52 changes independently of the number of rings 1.

Regarding the number of rings to be deposited, there is no limitation other than the area available on the rotary table. Thus, it is possible for one ring 1 or for a plurality of rings to be deposited. The greater the number of sources 52, the greater will be the speed of deposition of the coating material 53 and, therefore, the greater the efficiency of the process.

Regarding the rotary table 50, rotation thereof may be either clockwise or counterclockwise. Moreover, although a first rotation movement W1 of the rotary table 50 and a second rotation movement W2 of the piston ring 1 are given, it should be mentioned that both may rotate in different directions or in the same direction, and that this direction may be either clockwise or counterclockwise.

Figure 3:
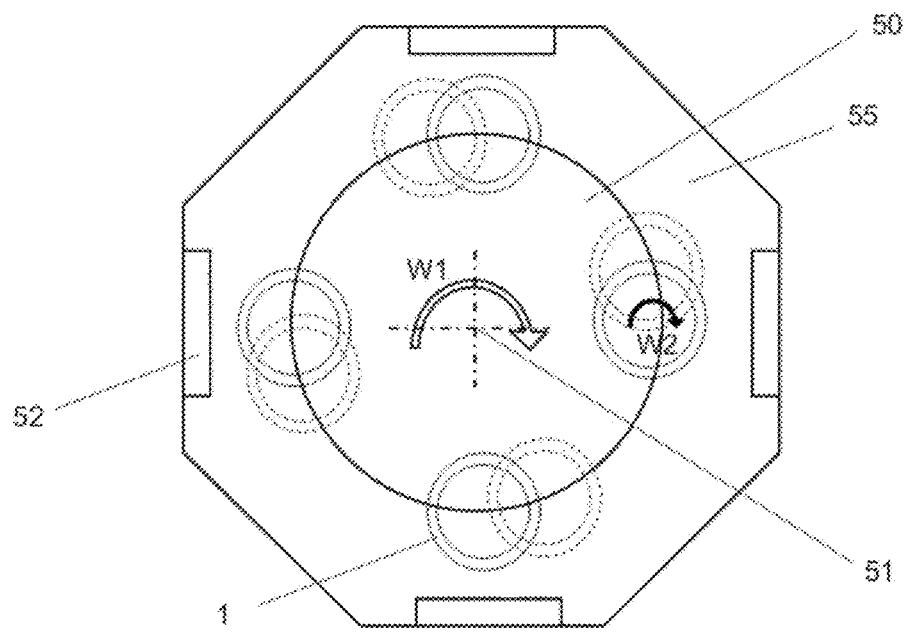
FIG. 3 shows a schematic representation of the conventional PVD process.

Usually, the PVD process for coating piston rings 1, illustrated in FIG. 3, comprises the fastening of at least one ring 1 on a rotary table 50 such that the rotary table performs a first rotation movement W1 about its central axis 51 and the ring 1 performs a second rotation movement W2 on the rotary table 50, the ring 1 receiving a deposition of coating material over the entire external surface 2, from 0° to 360°.

In the conventional PVD process, the speed of the rotation movements is maintained constant, thereby defining a uniform thickness of coating 5 over the entire external surface 2 of the piston ring 1.

The PVD process described in the prior art is performed in accordance with the conventional process, but at a varying speed of rotation. Thus, when the first half 21 of the ring 1 is opposite a source 52 of coating material 53, the speed of rotation is reduced, thereby guaranteeing that the first half 21 of the ring 1 has a coating layer 5 that is thicker than the second half 22 of the external surface 2 of the ring 1.

However, in addition to the disadvantage in terms of precise control of the speed of rotation, the prior-art PVD process has the further disadvantage that the vicinity of ends 31, 32 of the gap 3 of ring 1 have a thicker coating layer 5, thereby increasing contact pressures between the ends 31, 32 of the ring 1 and the cylinder.

The coating process proposed by the present invention comprises the application of a coating using a PVD process performed as at least two steps, which may be alternated in terms of sequence of execution.

Figure 4:
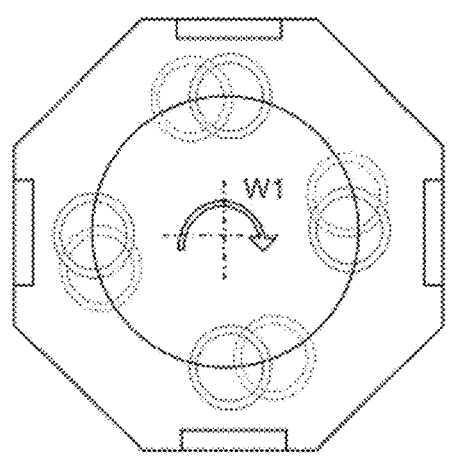
FIG. 4 shows a schematic representation of step 1 of the PVD process of the present invention.

As may be seen in FIG. 4, in step 1 of the coating process the piston ring 1 is fastened to the rotary table 50 such that the first half 21 of the ring 1 lies opposite the source 52 of coating material 53. In this step, only the rotary table 50 performs the first rotation movement W1 about the central axis 51, while the piston ring 1 remains stationary in relation to the rotary table 50. The objective of this first step is a first deposition of the coating material 53 and it achieves around ⅔ (two thirds) of the final thickness of the coating layer 5.

Figure 5:
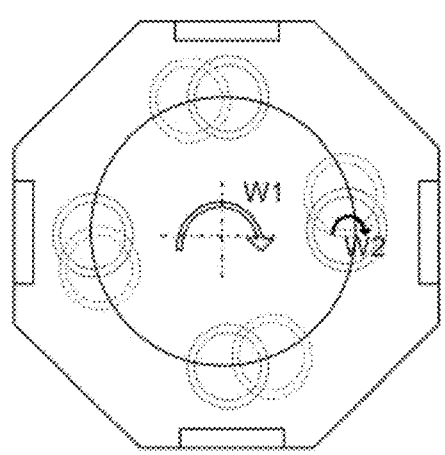
FIG. 5 shows a schematic representation of step 2 of the PVD process of the present invention.

In step 2 of the process, shown in FIG. 5, not only the rotary table 50 but also the piston ring 1 perform a rotation movement. The rotary table 50 performs a first rotation movement W1 about the central axis 51 while the piston ring 1 performs a second rotation movement W2 on the rotary table 50. In this step, there is a second deposition of the coating material 53 over the entire external surface 2 from 0° to 360° of the ring 1. Thus, the first half 21 of the ring 1 will achieve the final thickness of the coating layer 5, which will be thicker in relation to the second half 22 of the ring 1. Alternatively, it should be noted that, between step 1 and step 2, the rings may receive a finishing process, which may be machining, lapping, grinding, sanding, honing, brushing, inter alia.

Figure 6:
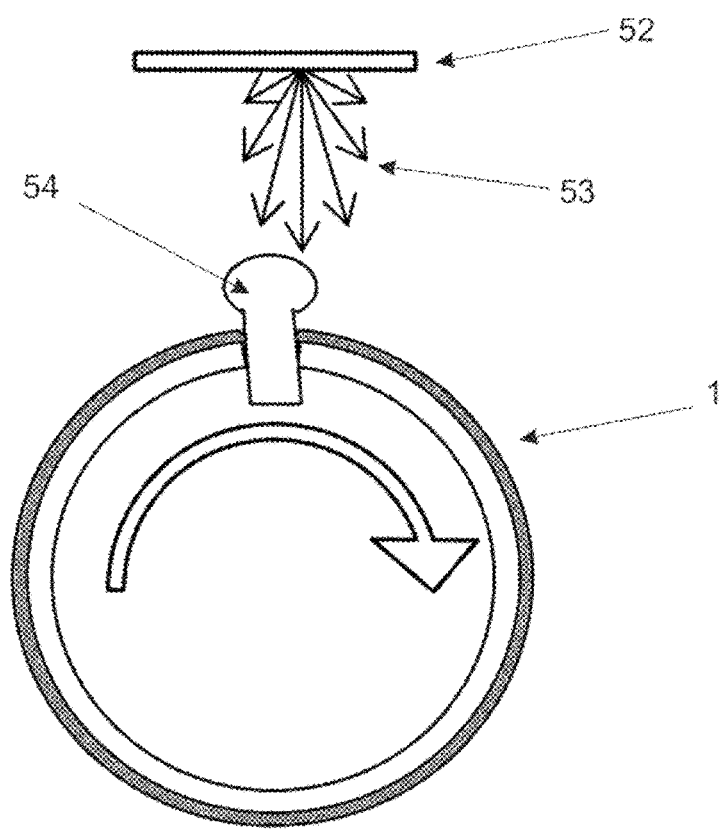
FIG. 6 shows a schematic representation of the use of a physical barrier in the PVD process.
Figure 7:
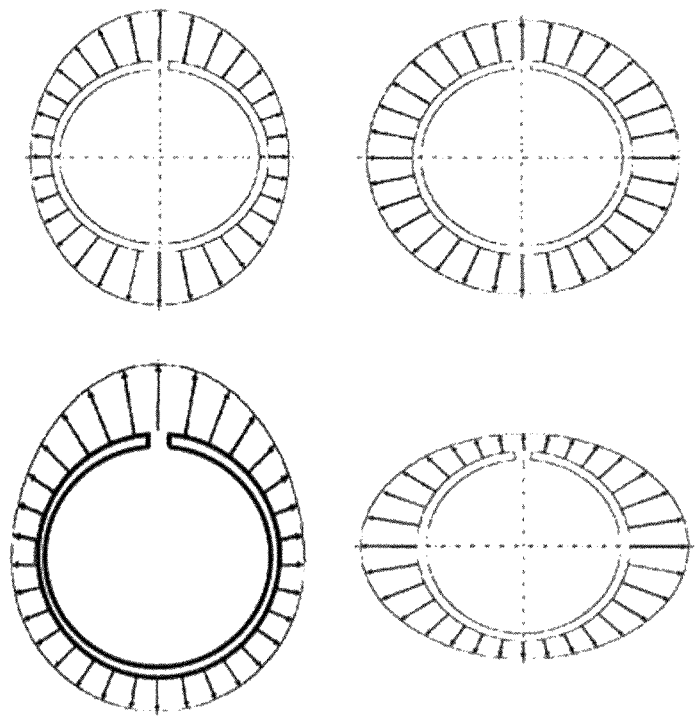
FIG. 7 shows a schematic representation of the thickness of the coating layer of the piston ring for the prior art and for the present invention.
Figure 7:
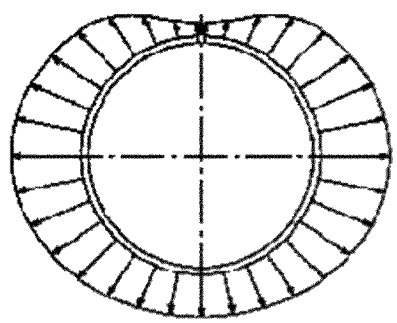

FIG. 6 shows that the PVD coating process further ensures that the thickness of the coating layer 5 in the vicinity of the first end 31 and in the vicinity of the second end 32 is preferably, but optionally, from 2% to 10% thinner than the thickness of the coating layer in the adjacent regions in the vicinity of the ends 31, 32 of the ring 1.

In a preferred construction, a physical barrier 54 is inserted between the ends 31, 32 of the gap 3 of the ring 1 so as to obstruct a fraction of the coating material 53 applied by the source 52, this resulting in a reduction in the thickness of the coating layer 5 in the vicinity of the first end 31 and in the vicinity of the second end 32 of the gap 3 of the ring 1.

In a second embodiment, the reduction in the thickness of the coating layer 5 in the vicinity of the ends 31, 32 of the gap 3 may be obtained by carrying out a machining process in such a manner as to remove the material after the coating process. Preferably, but optionally, the machining processes used may be the process of brushing or lapping.

The reduction in the thickness of the coating layer in the vicinity of the ends 31, 32 aims to reduce the contact pressure so as to allow better lubrication and consequently less wear of the ring 1.

The division of the PVD coating process into two steps enables the process parameters to be adjusted in such a manner as to reduce compressive stresses applied during deposition of the material 53, resulting in greater thicknesses of the coating layer 5. This trick of optimizing the stresses in the coating layer 5 is not possible with the PVD process known in the prior art, thus, it is possible to achieve thicknesses greater than the 50 microns described in the prior art. It is also feasible to achieve thicknesses of 70 microns, or even thicknesses greater than 100 microns. It should be noted that any value below 110 microns may be obtained.

Furthermore, the process of the present invention allows different materials to be applied during the first and the second steps. For example, in the first step it is possible to apply a material with high wear resistance while in the second step it is possible to apply a material with low sliding wear and less wear resistance.

Naturally, the layers which can be applied by PVD methods are not restricted to the chemical composition thereof, i.e. layers of nitrides, carbides and other compounds can also be applied, for example CrN, TiN, NbN, CrCN, CrCN, inter alia. The solution described in the present invention can also be applied when the layer obtained by PVD has a multi-layer or superstructure architecture, i.e. multi- or nano-layers of CrN/NbN independent of the thickness of the individual layers that form these multi-layers. Another design that can also be applied is, during steps 1 and 2 of deposition, possibly applying materials of different chemical composition or microstructure, for example a thick coating of CrN is applied in the adjacent region in the vicinity of the ends (31, 32) and, on this material, a different material, for example a layer of non-hydrogenated amorphous carbon, or any other material.

These advantages cannot be achieved using the processes described in the prior art as they are continuous processes and constitute only one step. Thus, the PVD coating process proposed by the present invention is based on the present technology but has a more advantageous process methodology that consequently results in a product of which the performance level differs, at least in terms of durability.

The piston ring 1 obtained by means of the PVD coating process proposed by the present invention is such that the first half 21 of the ring 1 has a thickness gradient for the coating layer 5 starting from at least 15 microns at 90° and 270° and ending at at least 15 microns in the adjacent regions in the vicinity of the ends 31, 32 of the gap 3. It should furthermore be noted that the vicinity of the ends 31, 32 have a coating layer 5 that is approximately 2% to 10% thinner than the adjacent regions in the vicinity of the ends 31, 32, and thus the vicinity of the first end 31 has a thickness of at least 55 microns and the vicinity of the second end 32 a thickness of at least 55 microns. Furthermore, the second half 22 of the ring, i.e. between 90°, 180°, and 270°, has a coating layer of uniform thickness of at least 15 microns.

A preferred embodiment having been described, it must be understood that the scope of the present invention encompasses other possible variations and is limited only by the content of the appended claims, which include the possible equivalents.

The invention claimed is:

1. A piston ring for internal-combustion engines, comprising: a body having a substantially annular external surface and a physical vapor deposition coating layer disposed on the external surface, the body including a gap defined between a first end and a second end, such that in a planar view of the piston ring, an x-axis and y-axis pass through a center of the piston ring, the y-axis intersecting with a center of the gap, and the x-axis orthogonal to the y-axis and passing through the piston ring, a first half defined by a circumferential angle of the piston ring above the x-axis and including the gap and a second half defined by the piston ring below the x-axis, wherein the coating layer of the first half and toward the first end from one side and toward the second end from the other side has thickness gradients that increase to a maximum thickness and as the coating approaches regions approximate the gap from either side, and the coating reduces in thickness from the maximum thickness toward a vicinity of the gap on each of the first end and second end, and wherein the coating layer of the second half has a uniform thickness.

2. The piston ring as claimed in claim 1, wherein the thickness gradient has a thickness of at least 15 microns and the maximum thickness of at least 55 microns.

3. The piston ring as claimed in claim 1, wherein the coating layer of the first half in the vicinity of the gap on the first end and the second end is approximately 2% to 10% less thick than the coating layer of the maximum thickness.

4. The piston ring as claimed in claim 1, wherein the coating layer of the first half in a region adjacent to the vicinity of the first end has a thickness of at least 55 microns and in a region adjacent to the vicinity of the second end has a thickness of at least 55 microns.

5. The piston ring as claimed in claim 1, wherein the coating layer of the second half has the uniform thickness of at least 15 microns.

6. The piston ring as claimed in claim 1, wherein the external surface is a sliding surface.

7. A method for coating an internal-combustion engine piston ring, comprising:
fastening at least one piston ring on a rotary table, the at least one piston ring including a gap positioned opposite at least one physical vapor deposition source of coating material;
performing a first rotation movement of the rotary table about a central axis while the at least one piston ring is stationary in relation to the rotary table, and receiving a first deposition of coating material on an external surface of the at least one piston ring in a region defined by a circumferential angle of 180° adjacent to a center of the gap by rotating the rotary table;
performing a relative rotation movement by performing the first rotation movement of the rotary table and performing a second rotation movement of the at least one piston ring relative to the rotary table such that the at least one physical vapor deposition source of coating material promotes a second deposition of coating material entirely along the external surface of the at least one piston ring; and
placing a physical barrier between the gap and the at least one source of coating material after at least one of performing the first rotation movement and performing the relative rotation movement;
wherein performing the first rotation movement and performing the relative rotation movement are alternated and wherein the first rotation movement and the second rotation movement are in opposite directions.

8. The method as claimed in claim 7, wherein the first deposition of coating material forms substantially two thirds of a final thickness of a coating layer.

9. The method as claimed in claim 7, wherein a coating material of the first deposition is different a coating material of the second deposition.

10. An internal-combustion engine, comprising: at least one piston ring including:
a body defining a substantially annular external surface and including a gap defined between a first end and a second end with a center of the gap defined as 0° and passing from 0° through 360°, the external surface having a first portion defined by a circumferential angle along the body of 180° that spans the center of the gap and extends from 270°, through 0°, to 90°, and a second portion defined by a circumferential angle along the body of from 90°, through 180°, and to 270° from the center of the gap;
a physical vapor deposition coating layer disposed on the external surface;
wherein the coating layer disposed on the first portion and toward the first end from one side and toward the second end from the other side has thickness gradients that increase to a maximum thickness and as the coating approaches regions approximate the gap from either side, and the coating reduces in thickness from the maximum thickness toward a vicinity of the gap on each of the first end and second end; and
wherein the coating layer disposed on the second portion has a uniform thickness.

11. The internal-combustion engine as claimed in claim 10, wherein the coating layer has a thickness of at least 15 microns and the maximum thickness of at least 55 microns.

12. The internal-combustion engine as claimed in claim 10, wherein the coating layer in the vicinity of the gap on the first end and the second end is approximately 2% to 10% less thick than the maximum thickness.

13. The internal-combustion engine as claimed in claim 10, wherein the coating layer of the second portion has the uniform thickness of at least 15 microns.

14. The internal-combustion engine as claimed in claim 10, wherein the external surface is a sliding surface.

15. The method as claimed in claim 7, wherein performing the first rotation movement and receiving the first deposition of coating material is followed by performing the relative rotation movement.

16. The method as claimed in claim 7, wherein the first rotation movement is one of the clockwise and counterclockwise, and the second rotation movement is the other of clockwise and counterclockwise.

17. The method as claimed in claim 7, wherein receiving the first deposition of coating material includes forming a coating layer via physical vapor deposition on the external surface with a varying thickness that increases towards the gap.

18. The piston ring as claimed in claim 1, wherein the coating layer disposed on the first half has a maximum thickness in a region of 10° and 350° from the center of the gap.

19. The piston ring as claimed in claim 18, wherein the coating layer diminishes in thickness from a region of 10° and 350° towards the first end and the second end, respectively.

* * * * *